United States Patent
Lin et al.

(10) Patent No.: US 11,388,834 B1
(45) Date of Patent: Jul. 12, 2022

(54) POWER DISTRIBUTION BOARD

(71) Applicant: Amazon Technologies, Inc., Seattle, WA (US)

(72) Inventors: Zhiyong Lin, Issaquah, WA (US); Hung The Pham, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/110,974

(22) Filed: Dec. 3, 2020

(51) Int. Cl.
*H05K 7/14* (2006.01)

(52) U.S. Cl.
CPC .................................. *H05K 7/1492* (2013.01)

(58) Field of Classification Search
CPC ....... H05K 7/1492; G06F 1/263; G06F 1/188; G06F 1/189; G06F 1/183
USPC ...................................................... 361/679.02
See application file for complete search history.

(56) References Cited

U.S. PATENT DOCUMENTS

| | | | |
|---|---|---|---|
| 9,320,166 B1 * | 4/2016 | Marr | G06F 1/263 |
| 9,392,720 B1 * | 7/2016 | Kim | H05K 7/1492 |
| 2008/0191552 A1 * | 8/2008 | Suzuki | H02J 1/001 |
| | | | 307/23 |
| 2009/0021078 A1 * | 1/2009 | Corhodzic | G06F 1/263 |
| | | | 361/627 |
| 2011/0255230 A1 * | 10/2011 | Mori | H05K 7/1492 |
| | | | 361/679.02 |
| 2015/0043146 A1 * | 2/2015 | Li | H05K 7/1487 |
| | | | 361/679.31 |
| 2016/0044820 A1 * | 2/2016 | Xu | H05K 7/20727 |
| | | | 361/679.31 |
| 2017/0150635 A1 * | 5/2017 | Huang | H05K 7/1492 |
| 2017/0168975 A1 * | 6/2017 | Heinrichs | H05K 7/1492 |
| 2019/0339747 A1 * | 11/2019 | Hsieh | G06F 1/3287 |

* cited by examiner

*Primary Examiner* — Adrian S Wilson
*Assistant Examiner* — Gage Crum
(74) *Attorney, Agent, or Firm* — Kilpatrick Townsend & Stockton LLP

(57) ABSTRACT

A power distribution board (PDB) may be mounted in a server and used to convert a main power signal to useable power by the server components. The PDB can be mounted on an interior sidewall of the server to maximize available component space of the server. The PDB can include a power transformation section and a power distribution section. The power transformation section can convert the incoming power to the useable power and the power distribution section can output the useable power to the server components. Additional PDBs can be added to the server to accommodate additional server components.

20 Claims, 3 Drawing Sheets

POWER DISTRIBUTION BOARD

BACKGROUND

A datacenter is a facility used to house a collection of datacenter electronic components such as computer servers and associated components, such as network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a pertinent part of the cost of operating a datacenter relates to the costs of installing or removing the electronic components from server racks. Such costs may be incurred by having to add or upgrade power components to accommodate larger electronic components.

BRIEF DESCRIPTION OF THE DRAWINGS

Various embodiments in accordance with the present disclosure will be described with reference to the drawings, in which.

DETAILED DESCRIPTION

Examples herein are directed to, among other things, systems and techniques relating to electronic components, such as servers, having one or more power distribution boards. The techniques described herein may be implemented by various power distribution boards, but particular examples described herein include an expandable power distribution board. The expandable power distribution board can be positioned in a server mounted in a server rack. The expandable power distribution board can include one or more sections, for example, a power transformation portion and a power distribution portion. The power transformation portion can receive an electrical signal from a central power source and output one or more electrical signals. The electrical signals can be received by the power distribution portion and distributed to a variety of electronics contained within the electronic component.

Turning now to a particular example, in this example, a server includes a chassis containing one or more electronics and an expandable power distribution board mounted to a sidewall of the chassis. The expandable power distribution board can include a power transformation portion electrically connected to a power distribution portion. The expandable power distribution board can be oriented to position the power distribution portion closer to the electronics than the power transformation portion. The power transformation portion can receive power from a main power source (e.g., a power source that supplies power to multiple servers) and convert the power to one or more output signals. For example, the power transformation portion can receive a 12 volt (V) power supply from the main power source and convert the power supply to a 12V output signal, a 12V standby signal, and/or one or more other voltage signals. The power distribution portion can receive the signals from the power transformation portion and output the signals to the electronics via electrical connections. The electronics can receive the signals and use them for power.

Exemplary embodiments are described herein with reference to rack units (abbreviated as "RU" or "U") which can be defined as 44.45 mm. For example, the height of a server can be described as 1U, 2U, and/or 4U. However, a rack unit may be defined as any suitable measurement.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
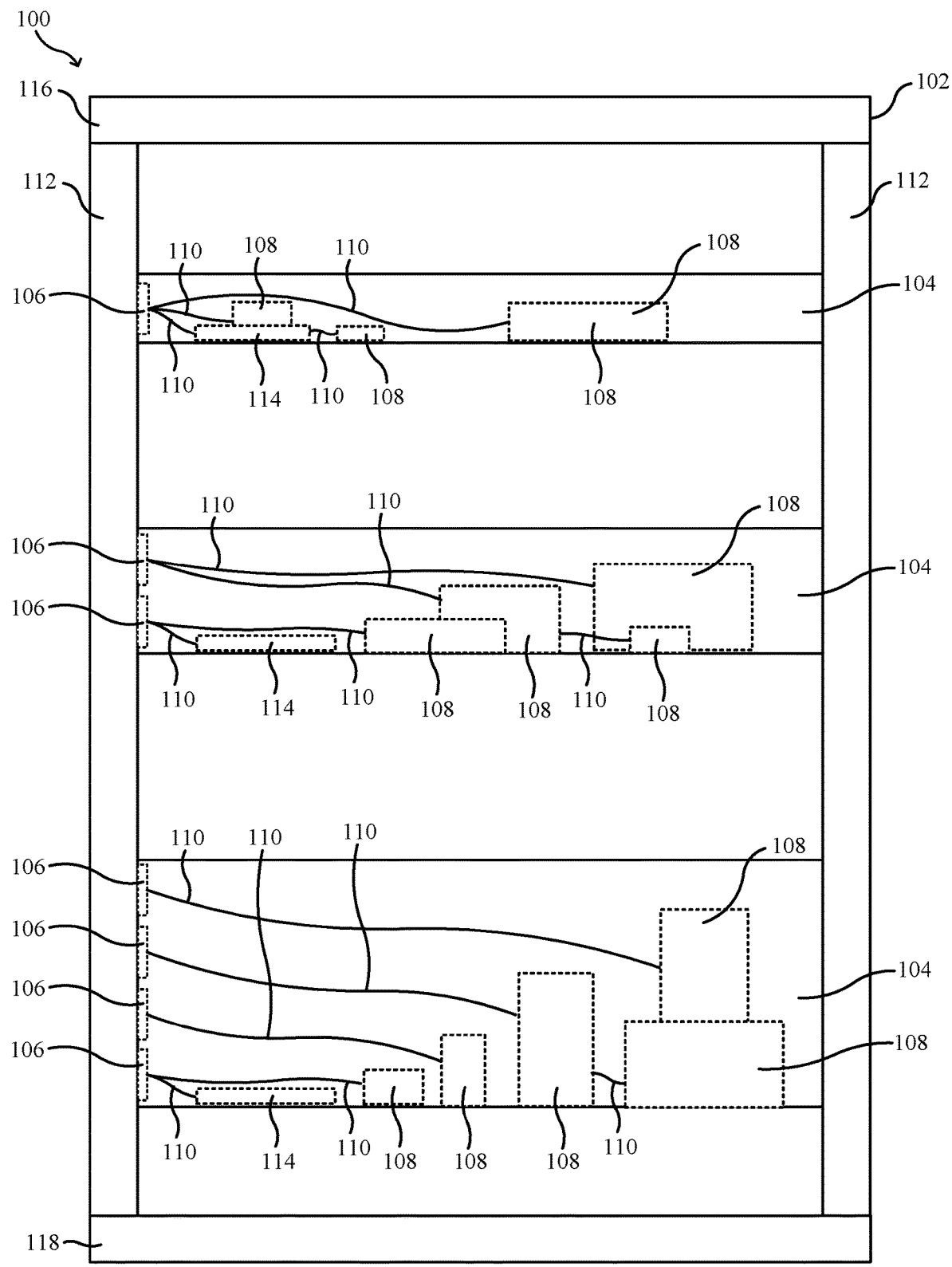
FIG. 1 illustrates a front view of a component rack system including a datacenter component rack and associated servers having power distribution boards in accordance with various embodiments.

Turning now to the figures, FIG. 1 illustrates a front view of a datacenter component system 100 including a component rack 102 and associated servers 104 having expandable power boards 106 (hereinafter referred to as "power boards 106"). The datacenter rack system 100 can be positioned in a datacenter environment, for example, a datacenter that includes multiple datacenter rack systems. The component rack 102 can include mounting points for mounting of the servers 104. For example, servers 104 can be distributed at various positions along the height of the component rack 102. The servers 104 can include one or more power boards 106 electrically coupled with electronic components 108 via wires 110.

The power boards 106 can include a power transformation portion electrically connected to a power distribution portion. The power boards 106 can receive an electrical signal from a main power source and distribute the power to the electronic components 108. For example, the power boards 106 can receive power from a main power source in the datacenter and distribute that power to the electronic components 108. The power boards 106 can convert the electrical signal to one or more electrical signals and distribute the one or more electrical signals to the electronic components 108. The power boards 106 can be positioned in the servers 104 to maximize space utilization and/or improve routing of the wires 110. For example, the power boards 106 can be mounted to a sidewall of the servers 104 and have an electrical connection area oriented towards the electronic components 108. In various embodiments, additional power boards 106 can be added to the server 104 to supply power to the electronic components 108.

The component rack 102 can receive servers 104 and one or more electronic components. The component rack 102 can include a set of sidewalls 112 spaced apart and connected to one another via an upper support 116 and/or a lower support 118 to form an opening for receiving the servers 104. For example, the sidewalls 112 can define opposite sides of a substantially cuboid or rectangular shape. The sidewalls 112 can include mounting points for receiving the servers 104 and/or the electronic components. For example, the sidewalls 112 can have holes that can be used for mounting of the servers 104. In various embodiments, the component rack 102 can be or include a cabinet rack, shelving, transport racks, portable racks, wall mount racks, telco racks or open frame racks.

The server 104 can be mounted in the component rack 102 and include various electronic components suitable for computing, storage, networking, or powering such equipment. For example, the server 104 can include one or more power boards 106 and electronic components 108. In various embodiments, the server 104 can be or contain JBODs, network switches, automatic transfer switches (ATSes), power distribution units (PDUs), or any other electronic equipment that is mountable in a component rack 102.

The electronic components 108 can include various components associated with computing, storage, networking, or powering the servers 104. For example, the electronic components 108 can include a motherboard 114. The motherboard 114 can be electrically coupled with one or more of the other electronic components 108. For example, the motherboard 114 can receive power from the power boards 106 and convert the power for use by other electronic components 108.

Figure 2:
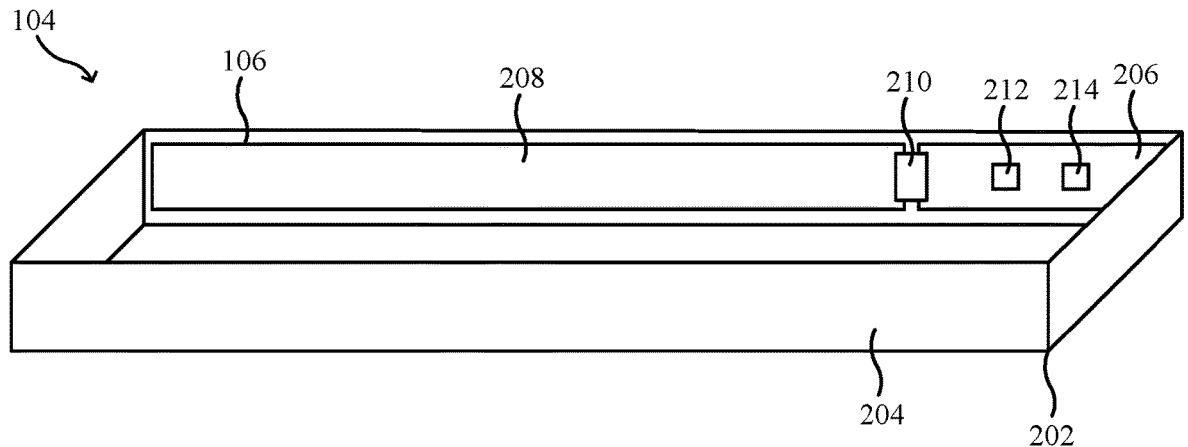
FIG. 2 illustrates an example server having a power distribution board for use with the datacenter component rack of FIG. 1, in accordance with at least one embodiment.

FIG. 2 shows an example server 104 having a power board 106 for use with the datacenter component system 100 of FIG. 1. For clarity, the server 104 is shown without electronic components 108, however, the server 104 can include one or more electronic components 108. The server 104 can include a chassis 202 that can include a base and sidewalls 204. The chassis 202 can have a height that is a multiple of rack units. For example, the chassis 202 can have a height of 1U, 2U, and/or 4U. The chassis 202 can be or include metal and/or any suitable material for supporting the power board 106 and/or electronic components 108.

The power board 106 can be positioned in the chassis 202, for example, to minimize the interior area taken up by the power board 106 compared with traditional mounting options. In various embodiments, the power board 106 can be mounted to a sidewall 204. Mounting the power board 106 to the sidewall 204 can leave more room in the chassis 202 compared with traditional mounting (e.g., mounting on the base). The additional room can be used, for example, for additional electronic components 108 to be included in the server 104.

The power board 106 can receive an electrical signal as an input and output an electrical signal. For example, the power board 106 can receive power (e.g., power from data center) and output power to the electronic components 108. In various embodiments, the power board 106 can include multiple sections, for example, multiple sections that can input an electrical signal and output an electrical signal to the electronic components 108. For example, the power board 106 can include a power transformation portion 206 and a power distribution portion 208. The power transformation portion 206 and the power distribution portion 208 can be electrically coupled via electrical connector 210. The electrical connector 210 can be or include wires, cables, fiber optics, and/or any suitable connector for connecting electrical components.

The power transformation portion 206 can receive the electrical signal as an input and convert the electrical signal to an output signal. For example, the power transformation portion 206 can receive power from the data center and convert the power to an electrical signal for use by the electronic components 108 (e.g., convert the power from the data center to a lower voltage and/or lower current). The power transformation portion 206 can be or include a circuit board with electrical traces. For example, the power transformation portion 206 can be or include a printed circuit board.

In various embodiments, the power transformation portion 206 can include one or more components for converting the input electrical signal to an output electrical signal. For example, the power transformation portion 206 can include a controller 212 and/or a transistor 214. The controller 212 can monitor the current being received by the power transformation portion 206 and turn off the current if a threshold has been exceeded. For example, if a power surge causes a current spike, the controller 212 can turn off the power. The controller 212 can additionally or alternatively monitor the temperature of the transistor 214 and/or can control the ramp when the server 104 is turned on. The controller 212 can be or include a hot swap controller and/or any suitable controller. The transistor 214 can act as a switch to turn on and off the power to the server 104. The transistor 214 can be or include any suitable transistor.

In some embodiments, the power transformation portion 206 can be removably disconnected from the power distribution portion 208. For example, the power transformation portion 206 can be disconnected from the power distribution portion 208 and replaced, for example, with another power distribution portion 208. Disconnecting the power distribution portion 208 can allow for replacing only a portion of the power board 106, for example, after a failure. This is an advantage over current power boards that require replacement of the entire power board.

In further embodiments, the power transformation portion 206 can be positioned closer to a power source feeding power to the servers 104 (e.g., in a first area of the server 104). The power transformation portion 206 can be positioned away from the power distribution portion 208 (e.g., positioned in a different area of the server 104). The power transformation portion 206 can be physically separated (e.g., by a divider positioned in the server 104) from the power distribution portion 208.

The power distribution portion 208 can receive the output signal from the power transformation portion 206 and output the signal to the electronic components 108. The power distribution portion 208 can be electrically connected to the electronic components 108 via one or more wires (e.g., wires 110). The power distribution portion can be or include a circuit board with electrical traces. For example, a printed circuit board with electrical traces.

In various embodiments, the power distribution portion 208 can be positioned separate from the power transformation portion 206 (e.g., the power distribution portion 208 can be positioned in a separate area from the power transformation portion 206). For example, in some embodiments, the power distribution portion 208 can be positioned in the server 104 closer to the electronic components than the power transformation portion 206. For example, the power distribution portion 208 can be positioned closer to the front of the server 104 than the back of the server. Positioning the power distribution portion 208 closer to the electronic components 108 can minimize the distance wires 110 need to travel between the power distribution portion 208 and the electronic components 108. The positioning of the power distribution portion 208 can additionally or alternatively allow for better routing the wires 110 compared to traditional servers.

In some embodiments, the power board 106 can include one of the power transformation portion 206 or the power distribution portion 208. For example, the power board 106 can include just the power transformation portion 206. However, the power board 106 may include just the power distribution portion 208. In further embodiments, the server 104 can include a power board 106 with both the power transformation portion 206 and the power distribution portion 208 and a power board 106 with only one of the power transformation portion 206 or the power distribution portion 208. For example, the power transformation portion 206 of a second power board 106 can be electrically coupled with the power distribution portion 208 of a first power board 106. Additionally or alternatively, a single power transformation portion 206 can be electrically coupled with multiple power distribution portions 208.

Figure 3:
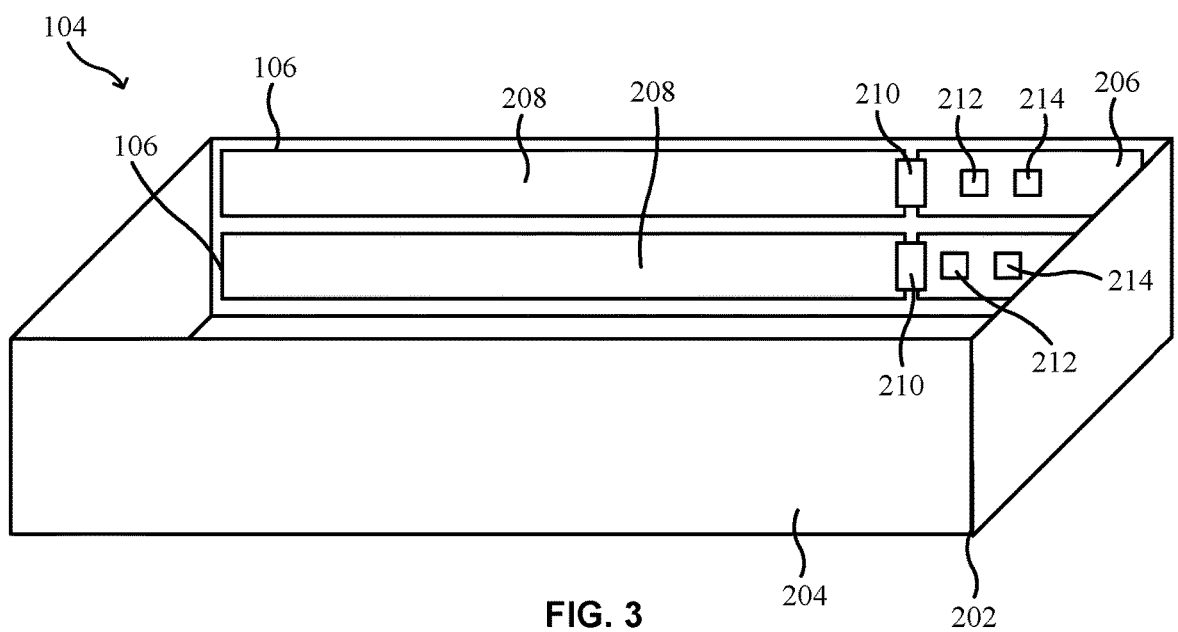
FIG. 3 illustrates another example server having multiple power distribution boards for use with the datacenter component rack of FIG. 1, in accordance with at least one embodiment.

FIG. 3 illustrates another example server 104 having multiple power boards 106 for use with the datacenter component system 100 of FIG. 1. Similar to FIG. 2, the server 104 is shown without electronic components 108, however, the server can include one or more electronic components 108. The sidewalls 204 of the chassis 202 are larger which can allow for larger electronic components 108 to be positioned within the server. The larger electronic components 108 may use more power than their smaller counterparts and multiple power boards 106 can be used to provide the additional power. As shown in FIG. 3, two power boards 106 can be positioned in the server 104. Each of the power boards 106 can include a power transformation portion 206 and a power distribution portion 208. As discussed in reference to FIG. 4, the power boards 106 can be coupled to one another, however, the power boards 106 may supply power to the electronic components 108 separately.

In various embodiments, additional power boards 106 can be added to the server 104. For example, as new and/or different electronic components 108 are added to the server 104 additional power boards 106 can be added to the server 104 to supply power to the new and/or different electronic components 108. Similarly, power boards 106 can be removed when less power is needed for the electronic components 108.

Figure 4:
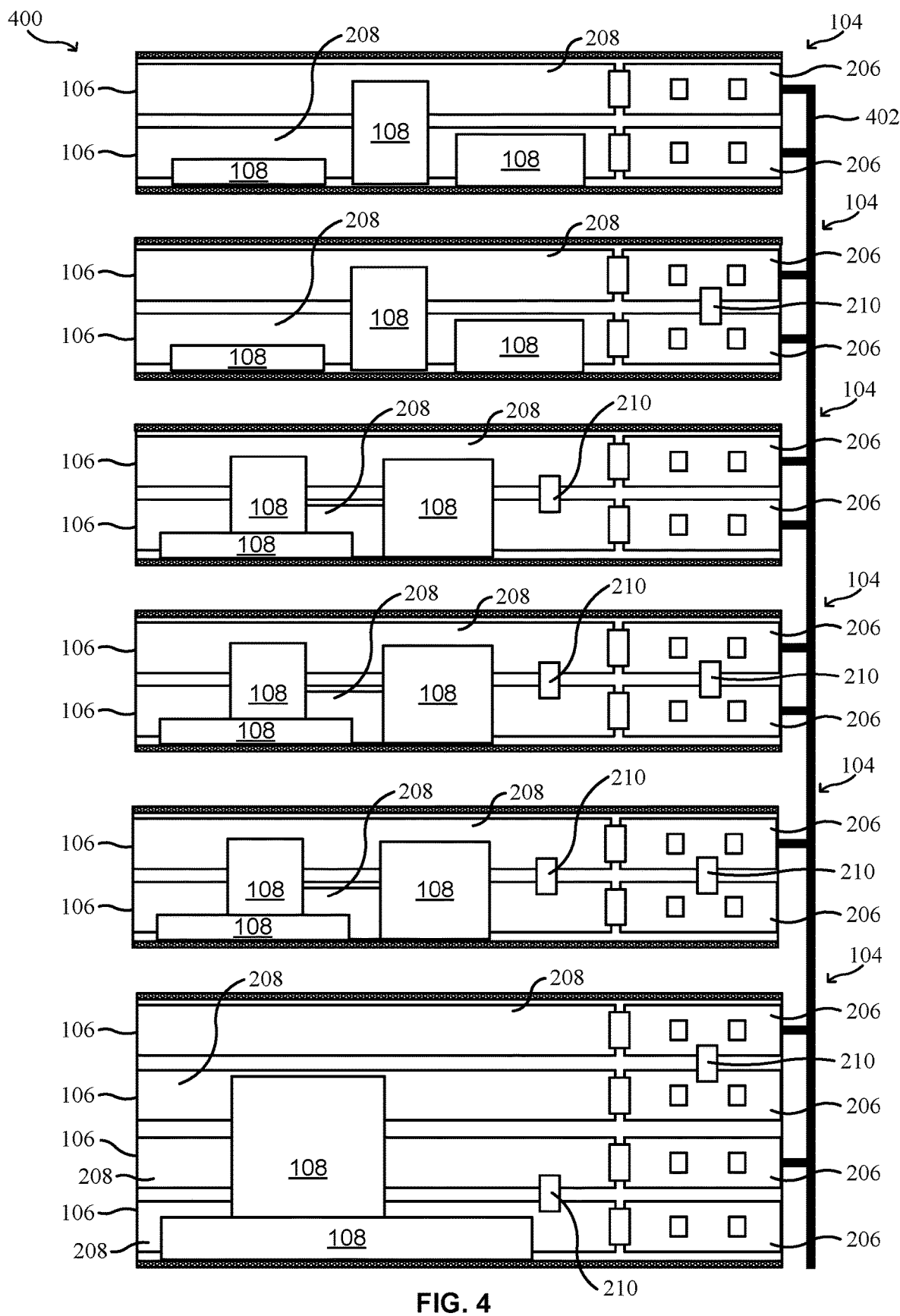
FIG. 4 illustrates a cross-section of an example component rack with associated servers including power distribution boards, in accordance with at least one embodiment.

Turning to FIG. 4, a cross section of an example datacenter rack system 400 is shown. The datacenter rack system 400 includes servers 104 of various sizes. The datacenter rack system 400 can be positioned in, for example, a component rack 102. The datacenter rack system 400 can include, for example, one or more servers 104 with a height of 1U, one or more servers 104 with a height of 2U, and/or one or more servers 104 with a height of 4U. As shown, the datacenter rack system 400 includes five servers 104 with a height of 2U and one server with a height of 4U. However, the datacenter rack system 400 can include any suitable number of servers 104. The servers 104 can include one or more power boards 106 and one or more electronic components 108. The power boards 106 can include a power transformation portion 206 electrically coupled with a power distribution portion 208 via an electrical connector 210. The power boards 106 can receive main power (e.g., power from the data center) via cables 402. The cables 402 can be run along one side of the component rack 102. For example, the cables 402 can be run along the back of the component rack 102.

The power boards 106 can be positioned in the servers 104 such that the power transformation portion 206 is positioned closer to the cables 402 than the power distribution portion 208. The power boards 106 can additionally or alternatively be positioned such that the power distribution portion 208 is positioned closer to the electronic components 108 than the power transformation portion 206. For example, the power transformation portion 206 can be positioned at the back of the component rack 102 and the power distribution portion 208 can be positioned at the front of the component rack 102.

In various embodiments, the power boards 106 can be electrically connected with one another, for example, with electrical connector 210. The power boards 106 can be electrically connected at one or more places. For example, the power transformation portions 206 of the power boards 106 can be electrically coupled, the power distribution portions 208 can be coupled, and/or the power transformation portions 206 and the power distribution portions 208 can be coupled. The coupled power boards 106 can each receive power from the cables 402, however, only one of the power boards may receive power from the cables 402. Coupling the power boards 106 can allow for additional and/or alternative electrical components to be installed in the servers 104. For example, coupling the power boards 106 can allow electronic components 108 that require more power to be installed.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments are described herein, including the many modes known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system comprising: a server rack; and a server mounted in the server rack and comprising: a chassis comprising a base and sidewalls defining an interior area; one or more electronic components positioned within a first portion of the interior area; a power distribution board comprising a power transformation portion and a power distribution portion, wherein the power transformation portion and the power distribution portion are mounted to an interior surface of one of the sidewalls, the power transformation portion being positioned within a second portion of the interior area and configured to receive a first electrical signal and output a second electrical signal to the power distribution portion, the power distribution portion being separate and removable from the power transformation portion and electrically coupled with one of the one or more electronic components, wherein the power distribution portion is positioned in the first portion of the interior area and configured to output the second electrical signal to the one of the one or more electronic components; and an electrical connector configured to electrically couple the power transformation portion with the power distribution portion and comprising first and second ends, the first end being detachable from the power transformation portion for removal of the power transformation portion from the chassis and the second end being detachable from the power distribution portion for removal of the power distribution portion from the chassis.

2. The system of claim 1, further comprising a second power distribution board comprising a second power transformation portion positioned within the second portion of the interior area and configured to receive the first electrical signal and output a third electrical signal to a second power distribution portion, wherein the second power distribution portion is positioned in the first portion of the interior area and is configured to output the third electrical signal to another of the one or more electronic components.

3. The system of claim 2, wherein the power distribution board is electrically coupled with the second power distribution board.

4. The system of claim 1, wherein the power transformation portion comprises at least one of a controller or a transistor.

5. The system of claim 1, wherein the first electrical signal comprises a 12V signal and the second electrical signal comprises one or more of a 12V signal, a 12V standby signal, a 3V signal, or a 5V signal.

6. The system of claim 1, wherein the one or more electronic components comprises a motherboard, a storage device, a CPU, a network card, a battery, an energy storage module, a fan, a network switch, an automatic transfer switch (ATS), or a power distribution units (PDU).

7. An electronic device comprising: a chassis comprising a base and sidewalls defining an interior area; an electronic component positioned within the interior area; a power distribution board comprising a power transformation portion and a power distribution portion, wherein the power transformation portion and the power distribution portion are mounted to an interior surface of one of the sidewalls, the power transformation portion being configured to change a first electrical signal to a second electrical signal and the power distribution portion being configured to output the second electrical signal to the electronic component; and an electrical connector configured to electrically couple the power transformation portion with the power distribution portion and comprising first and second ends, the first end being detachable from the power transformation portion for removal of the power transformation portion from the chassis and the second end being detachable from the power distribution portion for removal of the power distribution portion from the chassis.

8. The electronic device of claim 7, wherein the power distribution board is a first power distribution board and the electronic device further comprises a second power distribution board comprising a second power transformation portion electrically coupled with a second power distribution portion.

9. The electronic device of claim 8, wherein the second power transformation portion is configured to change the first electrical signal to a third electrical signal and the power distribution portion is configured to output the third electrical signal to the electronic component.

10. The electronic device of claim 8, wherein the first and second power distribution boards are electrically coupled and the second power distribution board is configured to receive the first electric signal from the first power distribution board.

11. The electronic device of claim 7, wherein the electronic device is dimensioned to be positioned in a server rack.

12. The electronic device of claim 7, wherein the power transformation portion comprises a controller configured to monitor a characteristic of the first electrical signal.

13. The electronic device of claim 12, wherein the controller is configured to turn off the first electrical signal in response to the characteristic exceeding a threshold value.

14. The electronic device of claim 7, further comprising a second electrical connector electrically coupling the power distribution portion with a second power distribution portion positioned within the interior area.

15. A system comprising: a server rack; a server mounted in the server rack and comprising: a chassis comprising a base and sidewalls defining an interior area; a plurality of electronic components positioned within the interior area; a power distribution board comprising a power transformation portion and a power distribution portion, wherein the power transformation portion and the power distribution portion are mounted to an interior surface of one of the sidewalls, the power transformation portion being electrically coupled with the power distribution portion, wherein the power transformation portion is configured to change a first electrical signal to a second electrical signal and the power distribution portion is electrically coupled with an electronic component of the plurality of electronic components; and an electrical connector configured to electrically couple the power transformation portion with the power distribution portion and comprising first and second ends, the first end being detachable from the power transformation portion for removal of the power transformation portion from the interior area and the second end being detachable from the power distribution portion to allow for removal of the power distribution portion from the interior area.

16. The system of claim 15, wherein the server further comprises a second power distribution board positioned within the interior area and comprising a second power transformation portion electrically coupled with a second power distribution portion.

17. The system of claim 15, wherein the power distribution portion is configured to output the second electrical signal to one or more of the electronic components.

18. The system of claim 15, further comprising a second power distribution board having a second power transformation portion configured to change the first electrical signal to a third electrical signal.

19. The system of claim 18, wherein the second power transformation portion is electrically coupled with the power distribution portion and the power distribution portion is configured to output the third electrical signal to one or more of the electronic components.

20. The system of claim 19, wherein the second power distribution board further comprises a second power distribution portion, wherein the power distribution portion is electrically coupled with the second power distribution portion and the power distribution portion and the second power distribution portion are configured to output the second or third electrical signals to one or more of the electronic components.

* * * * *